United States Patent
Branover et al.

(10) Patent No.: US 8,656,198 B2
(45) Date of Patent: Feb. 18, 2014

(54) METHOD AND APPARATUS FOR MEMORY POWER MANAGEMENT

(75) Inventors: Alexander Branover, Chestnut Hill, MA (US); Maurice B. Steinman, Marlborough, MA (US); Anthony Asaro, Toronto (CA); James B. Fry, Aurora (CA)

(73) Assignees: Advanced Micro Devices, Sunnyvale, CA (US); ATI Technologies ULC, Markham (CA)

( * ) Notice: Subject to any disclaimer, the term of this patent is extended or adjusted under 35 U.S.C. 154(b) by 441 days.

(21) Appl. No.: 12/767,460

(22) Filed: Apr. 26, 2010

(65) Prior Publication Data

US 2011/0264934 A1    Oct. 27, 2011

(51) Int. Cl.
G06F 1/00    (2006.01)

(52) U.S. Cl.
USPC .............. 713/323; 713/320; 710/57; 345/531

(58) Field of Classification Search
USPC ........ 713/320–340; 345/531, 534; 710/52, 57
See application file for complete search history.

(56) References Cited

U.S. PATENT DOCUMENTS

| 4,980,836 | A * | 12/1990 | Carter et al. | 713/322 |
|---|---|---|---|---|
| 5,396,635 | A * | 3/1995 | Fung | 713/323 |
| 5,617,572 | A * | 4/1997 | Pearce et al. | 713/323 |
| 5,692,202 | A * | 11/1997 | Kardach et al. | 713/324 |
| 6,334,167 | B1 * | 12/2001 | Gerchman et al. | 711/106 |
| 6,657,634 | B1 * | 12/2003 | Sinclair et al. | 345/534 |
| 7,028,200 | B2 * | 4/2006 | Ma | 713/324 |
| 7,085,941 | B2 * | 8/2006 | Li | 713/300 |
| 7,428,644 | B2 * | 9/2008 | Jeddeloh et al. | 713/300 |
| 7,437,579 | B2 * | 10/2008 | Jeddeloh et al. | 713/300 |
| 7,496,777 | B2 * | 2/2009 | Kapil | 713/324 |
| 7,613,941 | B2 * | 11/2009 | Samson et al. | 713/323 |
| 7,743,267 | B2 * | 6/2010 | Snyder et al. | 713/320 |
| 7,800,621 | B2 * | 9/2010 | Fry | 345/531 |
| 7,802,060 | B2 * | 9/2010 | Hildebrand | 711/154 |
| 7,840,827 | B2 * | 11/2010 | Dahan et al. | 713/324 |
| 7,868,479 | B2 | 1/2011 | Subramaniam | |
| 7,873,850 | B2 | 1/2011 | Cepulis | |
| 7,899,990 | B2 | 3/2011 | Moll | |
| 8,181,046 | B2 * | 5/2012 | Marcu et al. | 713/320 |
| 8,402,232 | B2 * | 3/2013 | Avudaiyappan et al. | 711/156 |

OTHER PUBLICATIONS

USPTO Board of Patent Appeals and Interferences. Ex parte Mehta et al. Appeal 2008-004853. U.S. Appl. No. 10/759,504. Decided Nov. 18, 2009.*
Yuan et al. Buffering Approach for Energy Saving in Video Sensors. IEEE International Conference on Multimedia and Expo. 2003.*
Intel Corporation. Intel Power Management Technologies for Processor, Graphics, Display, and Memory. White Paper. Aug. 2010.*

* cited by examiner

*Primary Examiner* — Matthew D Spittle
(74) *Attorney, Agent, or Firm* — Meyertons Hood Kivlin Kowert & Goetzel; Erik A. Heter

(57) ABSTRACT

A method for power management is disclosed. The method may include monitoring requests for access to a memory of a memory subsystem by one or more processor cores; and monitoring requests for access to the memory conveyed by an input/output (I/O) unit. The method may further include determining if at least a first amount of time has elapsed since any one of the processor cores has asserted a memory access request and determining if at least a second amount of time has elapsed since the I/O unit has conveyed a memory access request. A first signal may be asserted if the first and second amounts of time have elapsed. A memory subsystem may be transitioned from operating in a full power state to a first low power state responsive to assertion of the first signal.

24 Claims, 11 Drawing Sheets

METHOD AND APPARATUS FOR MEMORY POWER MANAGEMENT

BACKGROUND

1. Field of the Invention

This invention relates to computer systems, and more particularly, to power management of memory subsystems.

2. Description of the Related Art

During the design of a computer or other processor-based system, many design factors must be considered. A successful design may require several tradeoffs between power consumption, performance, thermal output, and so forth. For example, the design of a computer system with an emphasis on high performance may allow for greater power consumption and thermal output. Conversely, the design of a portable computer system that is sometimes powered by a battery may emphasize reducing power consumption at the expense of some performance.

Various system components may contribute a disproportionate amount to the power consumption of a processor-based system. In particular, those components that make the largest contribution to system performance may also consume the most power. For example, processors may consume more power than other system components, with the power consumption increasing with the number of processor cores included. In computers and other processor-based systems, the contribution of memory to overall power consumption is increasing. For example, in personal computer systems (both desktop and portable systems), the amount of DRAM (dynamic random access memory) has increased with demands for increased system performance. The power consumption of memory thus takes on more significance as a factor in the design of a system. Higher performance for memory-based systems may result in higher power consumption from the system memory. Conversely, limiting power consumption of a system memory may in turn limit system performance.

SUMMARY OF THE DISCLOSURE

A method for power management is disclosed. In one embodiment, the method includes monitoring requests for access to a memory of a memory subsystem by one or more processor cores; and monitoring requests for access to the memory conveyed by an input/output (I/O) unit. The method further includes determining if at least a first amount of time has elapsed since any one of the processor cores has asserted a memory access request and determining if at least a second amount of time has elapsed since the I/O unit has conveyed a memory access request. A first signal may be asserted if the first and second amounts of time have elapsed. A memory subsystem may be transitioned from operating in a full power state to a first low power state responsive to assertion of the first signal.

In one embodiment, a system includes one or more processor cores, an input/output (I/O) unit, a memory subsystem including a memory and a memory controller, and a power management unit. The power management unit may monitor requests for access to the memory by each of the one or more processor cores, and may also monitor requests for access to the memory conveyed by an input/output (I/O) unit. Based on the monitoring, the power management unit may determine if at least a first amount of time has elapsed since any one of the processor cores has asserted a memory access request, and may also determine if at least a second amount of time has elapsed since the I/O unit has conveyed a memory access request. If the first and second amounts of time have elapsed, the power management unit may assert a first signal. The first signal may be received by a memory subsystem. Responsive to receiving the first signal, the memory subsystem may transition from a full power state to a low power state.

BRIEF DESCRIPTION OF THE DRAWINGS

Other aspects of the invention will become apparent upon reading the following detailed description and upon reference to the accompanying drawings in which.

Figure 1A:
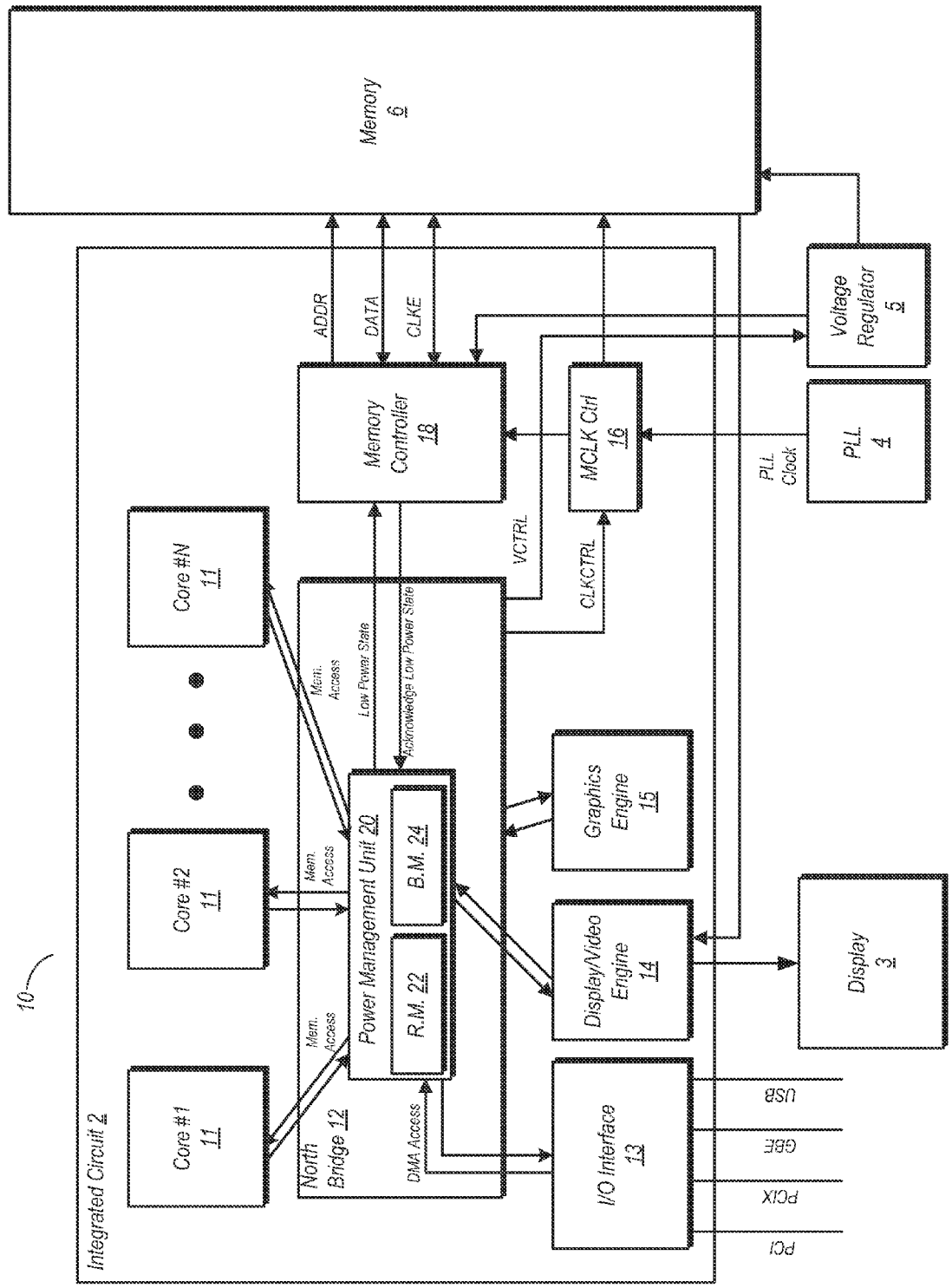
FIG. 1A is a block diagram of one embodiment of an integrated circuit (IC) coupled to a memory.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Processor With Power Management Unit:

FIG. 1A is a block diagram of one embodiment of an integrated circuit (IC) coupled to a memory. IC 2 and memory 6, along with display 3, phase-locked loop (PLL) 4 and voltage regulator 5 form at least a portion of computer system 10 in this example. In the embodiment shown, IC 2 is a processor having a number of processor cores 11. In various embodiments, the number of processor cores may be as few as one, or may be as many as feasible for implementation on an IC die. In multi-core embodiments, processor cores 11 may be identical to each other (i.e. symmetrical multi-core), or one or more cores 11 may be different from others (i.e. asymmetric multi-core). Processor cores 11 may each include one or more execution units, cache memories, schedulers, branch prediction circuits, and so forth. Furthermore, each of processor cores 11 may be configured to assert requests for access to memory 6, which may function as the main memory for computer system 10. Such requests may include read requests and/or write requests, and may be initially received from a respective processor core 11 by north bridge 12.

I/O interface 13 is also coupled to north bridge 12 in the embodiment shown. I/O interface 13 may function as a south bridge device in computer system 10. A number of different types of peripheral buses may be coupled to I/O interface 13. In this particular example, the bus types include a peripheral component interconnect (PCI) bus, a PCI-Extended (PCI-X), a PCIE (PCI Express) bus, a gigabit Ethernet (GBE) bus, and a universal serial bus (USB). However, these bus types are exemplary, and many other bus types may also be coupled to I/O interface 13. Peripheral devices may be coupled to some or all of the peripheral buses. Such peripheral devices include (but are not limited to) keyboards, mice, printers, scanners, joysticks or other types of game controllers, media recording devices, external storage devices, network interface cards, and so forth. At least some of the peripheral devices that may be coupled to I/O unit 13 via a corresponding peripheral bus may assert memory access requests using direct memory access (DMA). These requests (which may include read and write requests) may be conveyed to north bridge 12 via I/O interface 13.

In the embodiment shown, IC 2 includes a display/video engine 14 that is coupled to display 3 of computer system 10. Display 3 may be a flat-panel LCD (liquid crystal display), plasma display, a CRT (cathode ray tube), or any other suitable display type. Display/video engine 14 may perform various video processing functions and provide the processed information to display 3 for output as visual information. Some video processing functions, such as 3-D processing, processing for video games, and more complex types of graphics processing may be performed by graphics engine 15, with the processed information being relayed to display/video engine 14 via north bridge 12.

In this particular embodiment, computer system 10 is arranged in a unified memory architecture (UMA), in which system memory (e.g., random access memory, or RAM) and video memory are shared. Accordingly, display/video engine 14 may access information for video processing from memory 6, which may allocate a certain portion of its storage capacity for video information. Display/video engine 14 may access the required information from memory 6 for processing. As will be discussed in further detail below, display/video engine 14 may include a buffer. Information access from memory 6 may be temporarily stored in such a buffer prior to processing by display/video engine 14.

Figure 1B:
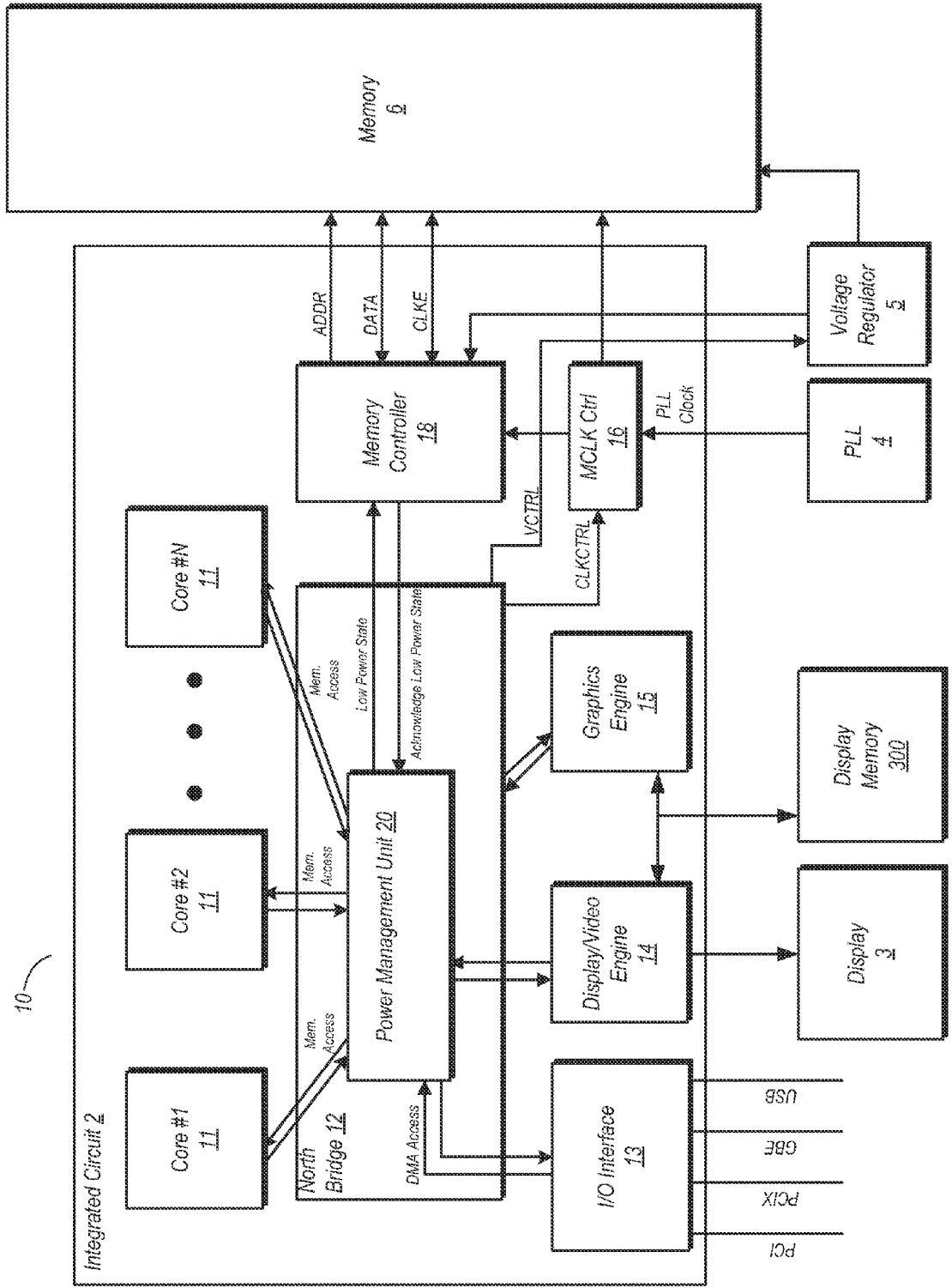
FIG. 1B is a block diagram of another embodiment of an IC coupled to a memory.

As an alternative to a UMA embodiment, FIG. 1B illustrates a non-UMA (NUMA) implementation, wherein video memory and RAM are separate from each other. In the embodiment shown, computer system 10 includes a display memory 300 coupled to display/video engine 14. Thus, instead of receiving video data from memory 6, video data may be accessed by display/video engine 14 from display memory 300. This may in turn allow for greater memory access bandwidth for each of cores 11 and any peripheral devices coupled to I/O interface 13 via one of the peripheral buses. It is noted that embodiments of computer system 10 are possible and contemplated wherein the system is originally configured in a UMA configuration and subsequently modified into a NUMA configuration. For example, if computer system 10 is configured to receive a video card having separate video memory, an owner of the system may install the video card in an aftermarket modification, thereby changing the original UMA configuration to a NUMA configuration.

Returning to FIG. 1A, a clock signal may be provided to IC 2 from PLL 4. Embodiments utilizing a delay locked loop (DLL) instead of a PLL are possible and contemplated. The clock signal output by PLL 4 in this embodiment may be provided to memory clock (MCLK) control unit 16, which may in turn provide clock signals to each of memory controller 18 and memory 6. MCLK control unit 16 may receive one or more clock control signals ('CLKCTRL') from north bridge 12, and may perform various control functions responsive to receiving these control signals. For example, based on signals received from north bridge unit 12, MCLK control unit 16 may reduce the frequency of a clock signal provided to memory controller 18 and/or memory 6. MCLK control unit 16 may also inhibit a clock signal from being provided to either of memory controller 18 and memory 6 in some cases. Furthermore, in times of increased performance demand, MCLK control unit 16 may restore the frequency of a clock signal from a reduced frequency to the frequency of the signal provided from PLL 4. Specific examples of clock control functions for certain power states will be discussed in further detail below.

At least some portions of IC 2 may receive power from voltage regulator 5. In this example, memory 6 is also coupled to receive power from voltage regulator 5. As will be discussed below, voltage regulator 5 may be controllable to reduce the voltage provided to memory controller 18 and/or memory 6 for operation in certain low power states, as well as being restored when returning to operation in a normal state. Control of the voltage(s) provided by voltage regulator 5 may be accomplished via voltage control ('VCTRL') signals received from north bridge 12.

Memory controller 18 in the embodiment shown is coupled to north bridge 12, and in some embodiments, may actually be a component of north bridge 12. Memory controller 18 may receive memory requests conveyed from north bridge 12. Data accessed from memory 6 responsive to a read request may be conveyed by memory controller 18 to the requesting agent via north bridge 12. Responsive to a write request, memory controller 18 may receive both the request and the data to be written from the requesting agent via north bridge 12. If multiple memory access requests are pending at a given time, memory controller 18 may arbitrate between these requests. Data may be conveyed between memory controller 18 and memory 6 via data lines ('DATA'), while memory controller 18 may convey an address targeted by a memory request via address lines ('ADDR'). Memory controller 18 may also enable or disable a clock signal provided to the devices of memory 6 using a clock enable ('CLKE') signal line.

Memory 6 in the embodiment shown may be implemented in one embodiment as a plurality of memory modules. Each of the memory modules may include one or more memory devices (e.g., memory chips) mounted thereon. In another embodiment, memory 6 may include one or more memory devices mounted on a motherboard or other carrier upon which IC 2 may also be mounted. In yet another embodiment, at least a portion of memory 6 may be implemented on the die of IC 2 itself. Embodiments having a combination of the various implementations described above are also possible and contemplated. Memory 6 may be used to implement a random access memory (RAM) for use with IC 2 during operation. The RAM implemented may be static RAM (SRAM) or dynamic RAM (DRAM). Type of DRAM that may be used to implement memory 6 include (but are not limited to) double data rate (DDR) DRAM, DDR2 DRAM, DDR3 DRAM, and so forth.

In the embodiment shown, north bridge 12 includes a power management unit 20. In the embodiment of FIG. 1A, power management unit 20 includes an request monitor (RM) 22 and a buffer monitor 24. RM 22 in the embodiment shown is configured to monitor memory access requests received from cores 11 and I/O interface 13. More particularly, RM 22 is configured to determine if a first predetermined amount of time has elapsed since any of cores 11 have asserted a memory access request. RM 22 is further configured in this embodiment to determine if a second amount of time has elapsed since a memory access request has been received from I/O interface 13. A first condition for entry into a low power state may be satisfied when the first and second times have elapsed.

The existence of a second condition for entry into the low power state may be determined by buffer monitor 24. Display/video engine 14 may include a buffer that stores information to be processed and then displayed on display 3. If the amount of data exceeds a predetermined threshold, the second condition may be satisfied. When both of the first and second conditions are present, power management unit 20 may assert a signal ('Low Power State') that enables the memory subsystem, including memory controller 18 and memory 6, to enter a first low power state from a full power state. Power management unit 20 may also be configured to enable the memory subsystem to enter additional low power states, as will be discussed below.

In the embodiment of FIG. 1B, RM 22 and buffer monitor 24 are not explicitly shown. Power management unit 20 in this embodiment may be implemented without buffer monitor 24 if computer system implements a NUMA configuration that cannot be modified into a UMA configuration. However, an embodiment of power management unit 20 as shown in FIG. 1A may also be implemented, wherein buffer monitor 24 is disabled in the NUMA configuration (or otherwise set to indicate the buffer is always full) and enabled in the UMA configuration. In an embodiments in which a NUMA configuration is implemented, the first condition as described above may be sufficient for enabling entry into the first low power state from the full power state. Upon entry into the first low power state (for both the embodiments of FIGS. 1A and 1B), memory controller 18 may provide an acknowledgment signal ('Acknowledge Low Power State') indicating that the low power state has been entered. In embodiments where more than one low power state is possible, the acknowledgement signal may be sent as a pulse indicating entry into a current low power state from a previous low power state (or from the full power state).

It should be noted that embodiments are possible and contemplated wherein the various units discussed above are implemented on separate IC's. For example, one embodiment is contemplated wherein cores 11 are implemented on a first IC, north bridge 12 and memory controller 18 are on another IC, while the remaining functional units are on yet another IC. In general, the functional units discussed above may be implemented on as many or as few different ICs as desired, as well as on a single IC.

Figure 2:
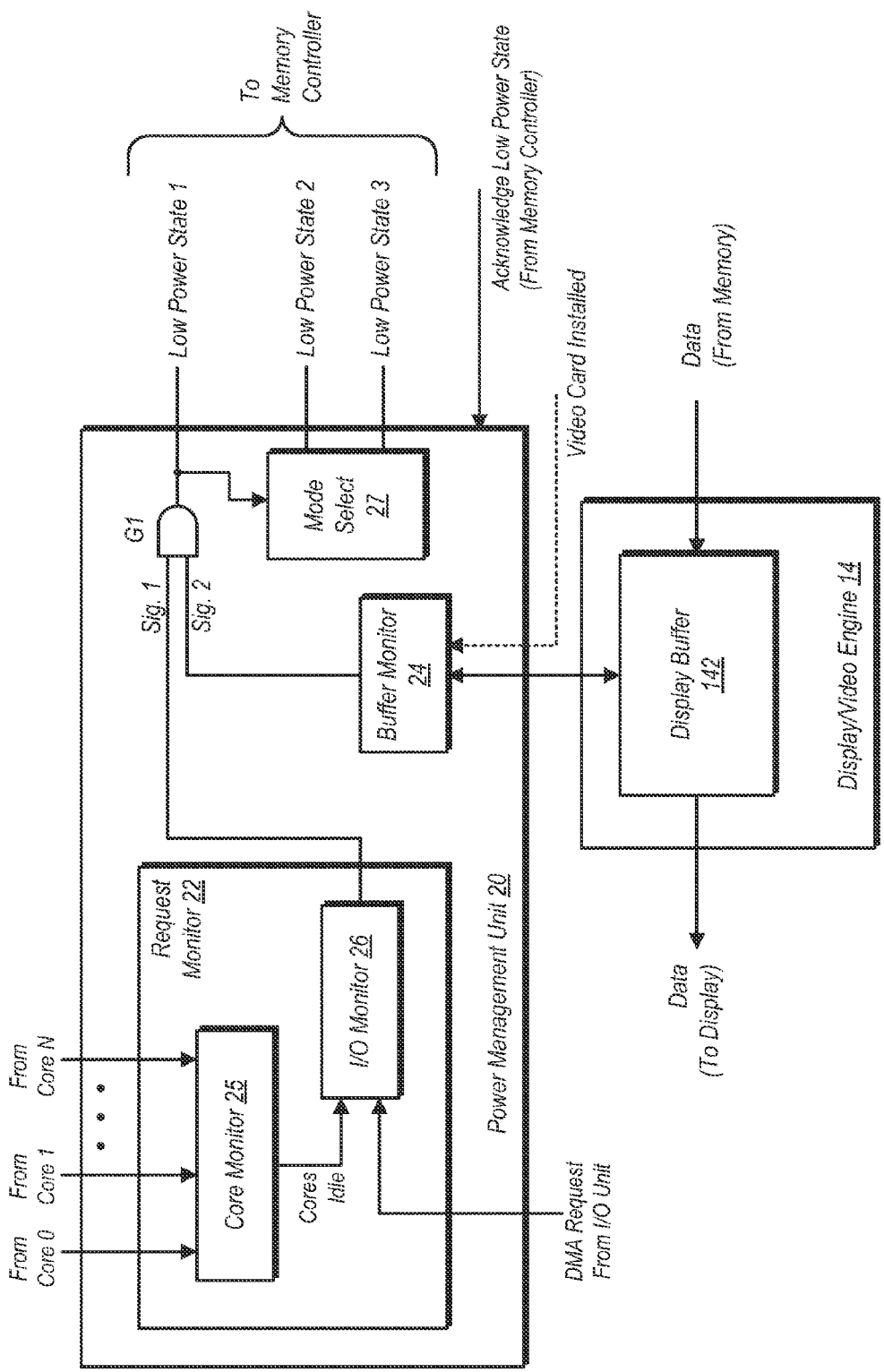
FIG. 2 is a block diagram of one embodiment of a power management unit.
Figure 3:
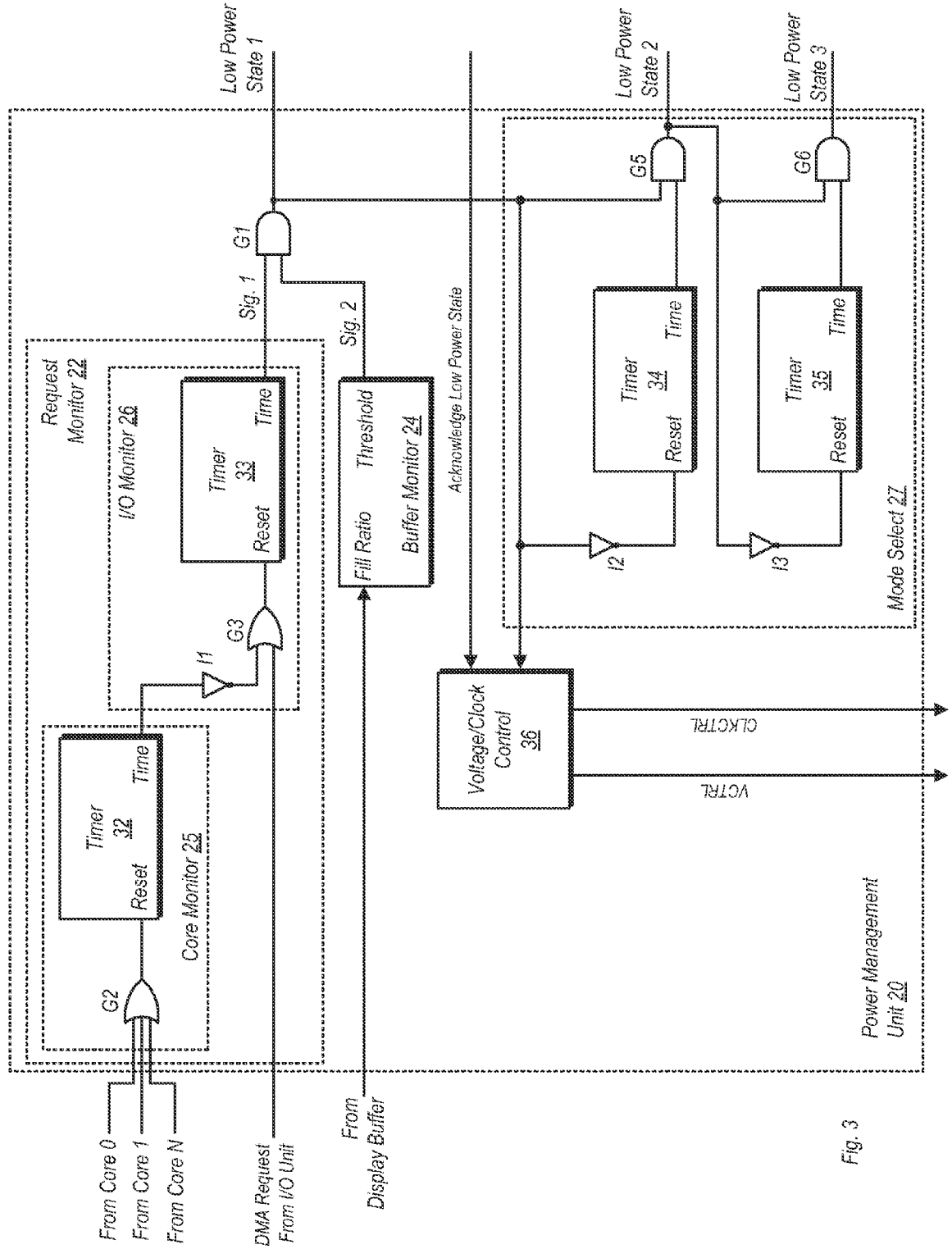
FIG. 3 is a diagram illustrating additional details of one embodiment of a power management unit.

Power Management Unit:

FIGS. 2 and 3 illustrate additional details for various embodiments of power management unit 20. The description of FIGS. 2 and 3 includes some references to elements that are shown in FIGS. 1A and/or 1B, but are not explicitly shown in these two drawings.

In the embodiment shown in FIG. 2, RM 22 includes a core monitor 25 and an I/O monitor 26. When any one of cores 1 through N asserts a memory access request, the request may be received by core monitor 25. Such requests may reset a timer configured to track the amount of time elapsed since the most recent request was received. The time may run until a first amount of time has elapsed, or until the timer is reset by the assertion of a memory access request prior to the elapsing of the first amount of time. Responsive to the elapsing of the first amount of time, a signal ('Cores Idle') may be asserted, thereby indicating that none of the cores 11 has requested access to the memory for at least the first amount of time. In other embodiments, a 'Cores Idle' condition may be indicated in other ways. For example, if IC 2 is a processor that conforms to the ACPI (Advanced Configuration and Power Interface) specification, core idleness for a particular core may be indicated whenever that core is in a non-C0 state, as requested by an operating system, driver, or other low or high level software. For a number of cores, core idleness may be indicated when each of the number of cores is in a non-C0 state. Furthermore, core idleness may be indicated when one or more of the cores is in the C0 state, but none has asserted a memory request for the first amount of time.

With regard to the processors that conform to the ACPI specification, the C0 state of a given core may be defined as a state in which that core is executing instructions. Additional states include, in order, a C1 state, the C2 state, and the C3 state. Each of the C1, C2, and C3 states progressively offer increased power savings over the previous state. Each of the C1, C2, C3 states may be non-executing states (i.e. where no instructions are executed). The use of the methodology disclosed herein with power control specifications other than the ACPI specification are also possible and contemplated. Such other power control specifications may include multiple operating states for each of the processor cores, with the different states reflecting a different level of performance and thus different power requirements.

The signal asserted by core monitor 25 may be received by I/O monitor 26, which is further coupled to receive indications of DMA requests conveyed by I/O unit 13. Responsive to receiving the Cores Idle signal from core monitor 25, I/O monitor 26 may begin running a second timer. The timer of I/O monitor 26 may run until either a DMA request from I/O unit 13 is received, a memory request is asserted by one of cores 11, a core transitions to the C0 state (in ACPI embodiments), or a second amount of time elapses. In this embodiment, the second amount of time is the sum of the first amount of time plus the sum of the time indicated by I/O monitor 26. The second amount of time may allow for hysterisis that may be associated with DMA requests from peripheral devices coupled to I/O unit 13 via a corresponding peripheral bus. When the second time has elapsed (indicating the absence of memory requests or DMA requests for the second amount of time), a first signal ('Sig. 1') may be asserted. The first signal may be received as one of two inputs to the two input AND gate, G1. The assertion of the first signal indicates the presence of a first condition necessary for transitioning the memory subsystem from a full power state to a first low power state.

Display/video engine 14 in the embodiment shown includes a display buffer 142. Buffer monitor 24 is coupled to display buffer 142 and is configured monitor the amount of data stored therein. Display buffer 142 in one embodiment may be a first-in first-out (FIFO) memory that may be filled by accessing data from memory 6. As the information displayed on display 3 is updated, display buffer 142 may be 'drained' (i.e. emptied) as the data stored therein is accessed and processed by display video engine 14. Buffer monitor 24 may determine whether the amount of data in display buffer 142 at a given time exceeds a threshold value. If the amount of data stored in display buffer 142 at a given time exceeds the threshold value, a second signal ('Sig. 2) may be asserted. The second signal may be received as a second input signal of AND gate G1. When both the first and second signals are asserted, AND gate G1 may assert a signal ('Low Power State 1') indicating that entry into a first low power state is enabled. This signal may be received by memory controller 18, which effects entry of a memory subsystem into the first low power state.

As previously noted, some embodiments of a computer system 10 may be arranged in a NUMA configuration, while others may be arranged in a UMA configuration. As also noted previously, some computer systems may be configurable between these two options (e.g., a personal computer configured to accommodate a video card having its own video memory). The description of the operation of power management unit 20 described above is directed to embodiments that employ a UMA configuration. For embodiments that are configured to a NUMA configuration, assertion of the first signal by I/O monitor 26 of RM 22 may be sufficient to assert the Low Power State 1 signal. In such embodiments, buffer monitor an AND gate G1 may not be required. In embodiments that are configurable between a NUMA configuration and a UMA configuration, buffer monitor 24 may be configured to receive an indication as to whether or not separate video memory is provided (e.g. if a video card with video memory is installed). In this particular example, buffer monitor 24 is coupled to receive a 'Video Card Installed' signal, as indicated by the dashed line. When this signal is asserted, indicating the presence of video memory separate from main memory 6, buffer monitor 24 may respond by holding the second signal in an asserted condition, enabling assertion of the Low Power State 1 signal responsive to the assertion of the first signal by I/O monitor 26 of power management unit 20. If the separate video memory is removed or is otherwise not present, operation may proceed as described above, with the second signal being asserted responsive to display buffer 142 storing an amount of data greater than the threshold value.

In the embodiment shown, power management unit 20 includes a mode select unit 27, which may be used for selection of additional low power states. Mode select unit 27 is coupled to the output of AND gate G1, and may thus receive an indication when a transition occurs from the full power state to the first low power state. After a given amount of time has elapsed operating in the first low power state, mode select unit 27 may assert another signal ('Low Power State 2') indicating to memory controller 18 that a second low power state may be entered. A third low power state may be entered after a given amount of time has elapsed operating in the second low power state, and may be indicated by assertion of the Low Power State 3 signal. It should be noted that, regardless of the low power state in which operations occur, assertion of a memory request by any of cores 11, transition of a core to the C0 state (in ACPI embodiments), a DMA request conveyed by I/O unit 13, or detection by buffer monitor 24 that the amount of data stored in display buffer 142 is less than the threshold value may cause an exit from the current low power state back to the full power state. In this embodiment, such an event may by indicated by de-assertion of the Low Power State 1 signal output by AND gate G1. De-assertion of the Low Power State 1 signal may cause the de-assertion of the Low Power State 2 and Low Power State 3 signals.

Entry into each of the low power states discussed herein may result in actions that reduce the power consumption of computer system 10. For example, entry into the first low power state from the full power state may include placing memory 6 into a self-refresh state. Entry into the second low power state may include the additional action of powering down a physical layer of a memory interface in memory controller 18. Entry into a third low power state may include, in addition to the above, reducing the operating voltage and inhibiting a clock signal provided to memory controller 18 and memory 6. Operation in the full power state may include operation at a rated voltage and a rated clock frequency of IC 2 that may enable computer system 10 to operate at its full performance level. These states will be discussed in further detail below.

Turning now to FIG. 3, a drawing illustrating additional details of one embodiment of power management unit 20 is shown. In the embodiment shown, core monitor 25 includes OR gate G2 and timer 32. OR gate G2 in this embodiment is an OR gate having N inputs, one for each processor core 11 implemented on IC 2. A signal (e.g., as a pulse) may be asserted on each of these inputs whenever the corresponding core 11 initiates a request for access to memory 6. The output of OR gate G2 is coupled to a reset input of timer 32, and thus the assertion of a request by any of the cores 11 may cause timer 32 to be reset. In embodiments utilizing only a single core 11, OR gate G2 is not required, and thus the assertion of a memory access request by the single core 11 may cause a reset of timer 32. Upon reset, timer 32 may begin running, and may continue running until either it is reset again or until the first amount of time has elapsed, thereby causing the assertion of the signal on the 'Time' output.

I/O monitor 26 in this embodiment includes inverter I1, OR gate G3, and timer 33. The output of OR gate G3 is coupled to the reset input of timer 33. For inputs, OR gate G3 is coupled to receive indications (e.g., as pulses) of DMA requests from I/O unit 13, as well as from the output of inverter I1. The input of inverter I1 in this embodiment is coupled to the output of timer 32. When the output of timer 32 is not asserted (e.g., low in this embodiment), the output of inverter I1 is high. This high may propagate through OR gate G3 to the reset input of timer 33. Thus, timer 33 may be held in a reset state until the first time has elapsed.

When the first time has elapsed and a signal is asserted on the output of timer 32, the state of the reset input of timer 33 is dependent on the DMA request line. If a DMA request is asserted, timer 33 may be reset. Timer 33 may also be reset responsive to a reset of timer 33. Following the de-assertion of a signal on its reset input, timer 33 may begin running until the second time is reached. When the second time is reached, timer 33 may assert the first signal, Sig. 1, which is provided as an input to AND gate G1. Buffer monitor 24, which may function as described above, may provide the second input (Sig. 2) to AND gate G1. When both inputs of AND gate G1 are asserted, the Low Power State 1 signal is asserted and provided to memory controller 18.

In addition to memory controller 18, state select unit 27 may also receive the Low Power State 1 signal. More particularly, in the embodiment shown, the Low Power State 1 signal may be received by the input to inverter I2 and to AND gate G5. The output of inverter I2 is coupled to the reset input of timer 34. When the Low Power State 1 signal is de-asserted (i.e. low in this embodiment), the output of inverter I2 is held high, and thus timer 34 may be held in a reset state. When the Low Power State 1 signal is asserted, the output inverter I1 may fall low, thus allowing timer 34 to exit the reset state. Timer 34 may ten run until a predetermined time has elapsed, and thus assert a signal on its time output. When the output of timer 34 and the Low Power State 1 signal are both asserted, the output of AND gate G5 ('Low Power State 2') is asserted, and thus the second low power state may be entered.

Assertion of the Low Power State 2 signal may cause similar operation for timer 35. The reset input of timer 35 may be held high when Low Power State 2 is low, since inverter I3 inverts this signal. The Low Power State 2 signal is also provided as one input to AND gate G6. Once timer 35 exits the reset state (responsive to the assertion of the Low Power State 2 signal), it may begin running until its predetermined time limit is reached. Responsive to this time elapsing, timer 35 may assert and output signal on its Time output, resulting in logic highs on both input of AND gate G6. This in turn results in the assertion of the Low Power State 3 signal, and thus entry into the third low power state may be enabled.

As previously noted, a memory access request initiated by a core 11, a DMA request conveyed by I/O unit 13, or a determination that the amount of data in display buffer 142 is less than the threshold value may cause a return to the full power state. When at least one of these events occurs, at least one of the first or second signals provided to AND gate G1 will fall low, and thus the output of AND gate G1 also falls low. When the output of AND gate G1 falls low, a first input to AND gate G5 falls low, and thus the Low Power State 2 signal falls low. In addition, timer 34 may also enter the reset state responsive to the Low Power State 1 signal falling low, and thus both inputs to AND gate G5 will be low. Similarly, when the Low Power State 2 signal falls low, a first input to AND gate G6 will fall low, followed by the second input of G6 falling low when timer 35 enters the reset state. Thus, the Low Power State 3 signal will also fall low responsive to one of the events described above.

When a low power state is entered, an acknowledgement signal ('Acknowledge Low Power State') may be received from memory controller 18. In the embodiment shown, the acknowledgement signal is received by voltage/clock control circuit 36. The acknowledgement signal may be received as a pulse, enabling voltage/clock control circuit 36 to distinguish between the low power states. In one embodiment, voltage/clock control circuit 36 includes a counter circuit that may be toggled by the acknowledgement pulse. The low power state may be determined by the counter value. In this embodiment, voltage/clock control circuit 36 is configured to reduce the voltage provided to the memory subsystem, as well as inhibiting a clock signal provided to the same. Voltage/clock control circuit 36 may effect the reduction of voltage provided to the memory subsystem by asserting a voltage control ('VCTRL') signal that is provided to voltage regulator 5, as shown in FIGS. 1A and 1B. Similarly, voltage/clock control circuit 36 may inhibit the clock signal may cause a clock signal normally received by memory controller 18 and memory 6 to be inhibited by assertion of the clock control signal ('CLKCTRL') that may be received by MCLK control unit 16, as also shown in FIGS. 1A and 1B.

Voltage/clock control circuit 36 is also coupled to receive the Low Power State 1 signal output by AND gate G1. If the Low Power State 1 signal falls low, responsive to an event such as the assertion of a memory access request by one of cores 11, voltage/clock control circuit 36 may de-assert the voltage control and clock control signals to enable re-entry into the full power state from one of the low power states.

Figure 4:
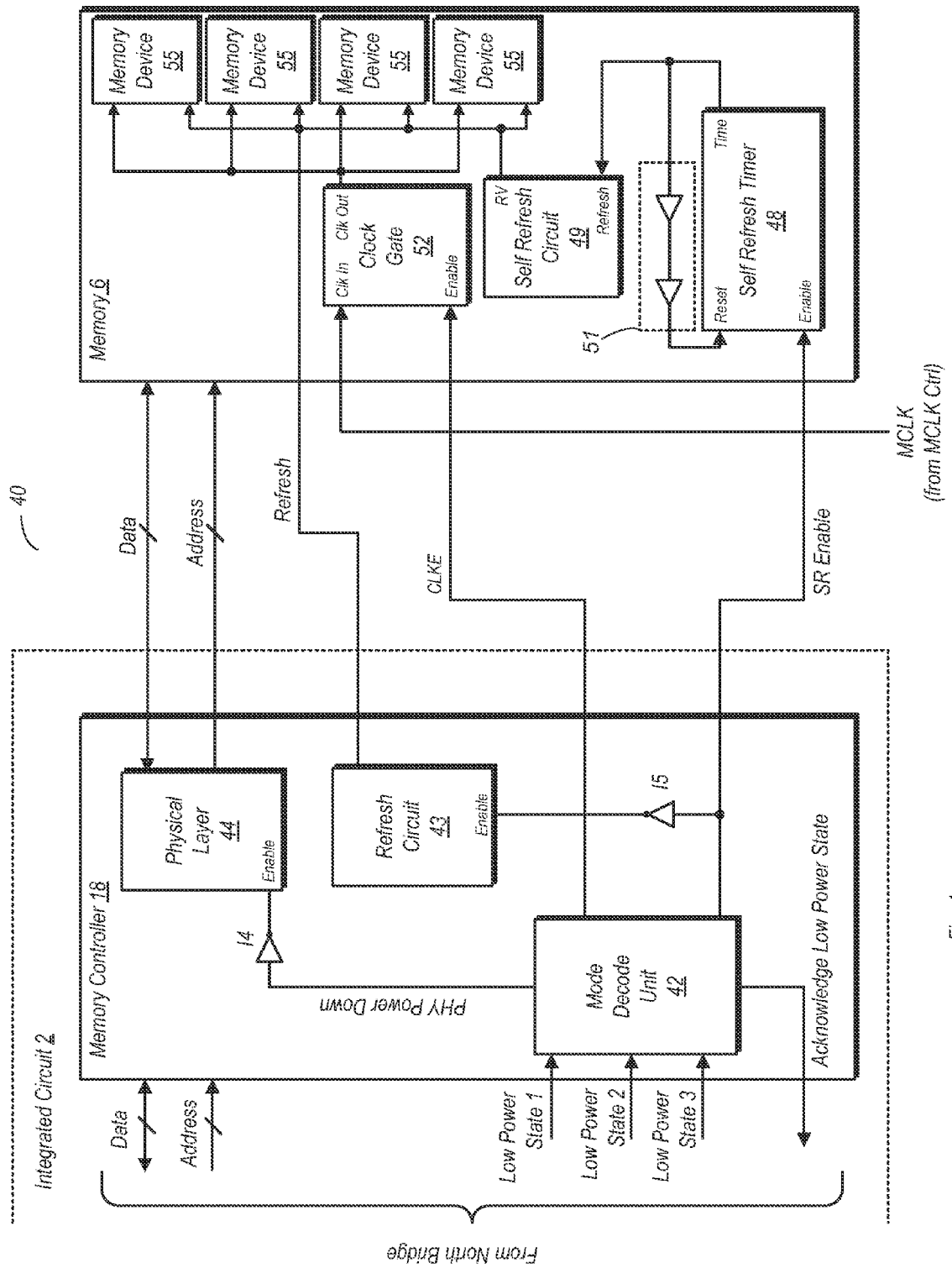
FIG. 4 is a block diagram of one embodiment of a memory subsystem.

Memory Subsystem:

Turning now to FIG. 4, an embodiment of a memory subsystem is shown. In the embodiment shown, memory subsystem 40 includes memory controller 18 and memory 6. In this particular embodiment, memory controller 18 is implemented on the same die as the other components of IC 2, while memory 6 is implemented separately. However, embodiments are possible and contemplated wherein at least a portion of memory 6 is implemented on the same die as the other components of IC 2. Furthermore, embodiments are possible and contemplated wherein memory controller 18 is implemented separately from the components of IC 2 (i.e. not on the same die).

In the embodiment shown, memory controller 18 includes a mode decode unit 42 coupled to receive the various low power state signals that may be asserted by power management unit 20. Mode decode unit 42 is configured to assert various signals responsive to receiving the various low power state signals in order to implement power saving actions. Memory controller 18 also includes a refresh circuit 43 configured to perform periodic refreshes of memory 6 when operating in the full power state. A physical layer 44 in the embodiment shown provides circuitry for interfacing memory controller 18 to memory 6.

Memory 6 in this embodiment includes a plurality of memory devices 55. These devices may be memory modules each having one or more memory chips, memory chips themselves mounted on a motherboard or memory module circuit board, or any other suitable means of implementing memory for random storage. Memory 6 also includes a self-refresh timer 48, a self-refresh circuit 49, and a clock gate 52.

When the embodiment shown is operating in the first low power state (i.e., Low Power State 1 is asserted, while Low Power State 2 and Low Power State 3 are de-asserted), mode decode unit 42 may assert a signal on the line labeled SR Enable. This may enable self-refresh timer 48, and thus cause memory subsystem 40 to enter a self-refresh mode. When entering the self-refresh mode, the assertion of the SR enable signal may cause the disabling refresh circuit 43, since the enable input of refresh circuit 43 is the complement of the SR enable signal in this embodiment (due to inverter I5). The assertion of the SR enable signal may also enable self-refresh timer 48, which may begin operating to time the self-refresh operation. When the self-refresh period has elapsed, self-refresh timer 48 may assert a signal on its 'Time' output, which may be received by the 'Refresh' input of refresh circuit 49. Responsive to receiving this signal, refresh circuit 49 may provide a refresh voltage on the output 'RV', which may be received by each of memory devices 55. Delay circuit 51 may also receive the signal asserted on the 'Time' output of self-refresh time 48. The output of delay circuit 51 in the embodiment shown is coupled to a reset input of self-timer 48. Providing this delay may ensure that the refresh operation is allowed sufficient time to complete. After the signal propagates through delay circuit 51, self-refresh timer 48 may be reset and the self-refresh cycle may begin again. Operation in the self-refresh mode may provide some power savings over performing the refresh operation using refresh circuit 43. In many typical DRAM implementations, operation in the self-refresh mode consumes less power than operation in the active state.

Operation in the second low power state (when the Low Power State 1 and Low Power State 2 signals are asserted, while the Low Power State 3 signal remains de-asserted) may include a continuation of operation in the self-refresh mode, and may also include the powering down of physical layer 44. When mode decode unit 42 detects operation in the second low power state, the 'PHY Power Down' signal may be asserted. The 'PHY Power Down' signal may be inverted by inverter I4, thereby de-asserting the enable input of physical layer 44. As a result, physical layer 44 may be powered down, providing additional power savings. A PLL associated with the PHY may also be powered down, adding further power savings.

Operation in the third low power state may occur when all three of the low power state signals are asserted. When initiating operation in the third low power state, mode decode unit 42 may de-assert the clock enable ('CLKE') provided to the enable input of clock gate 52. This in turn may inhibit a clock signal from being provided to memory devices 55 from clock gate 52. In addition, the embodiment of mode decode unit 42 illustrated here is configured to assert the acknowledgement signal, as a pulse, each time a new low power state is entered. This pulse may be received by the voltage/clock control circuit 36 of power management unit 20 shown in FIG. 3. Responsive to receiving the pulse, voltage/clock control circuit 36 may, as described above, assert voltage control and clock control signals. The assertion of the voltage control signal may result in a reduction of the voltage provide to memory subsystem 40 by voltage regulator 5. Assertion of the clock control signal may cause MCLK control unit 16 to inhibit the clock signal from being provided to memory controller 18. Voltage control/clock unit 36 may delay the assertion of the clock control signal to ensure that other functions may be performed prior to inhibiting the clock signal. As previously noted above, of the Low Power State 1 signal falls low (causing re-entry into the full power state), voltage control/clock circuit 36 may de-assert both the voltage control and clock control signals.

It should be noted that the hardware embodiments discussed above are exemplary, and other embodiments capable of switching power states based on events such as those described above are also possible. In general, any suitable configuration capable of switching between a full power state and one or more low power states may be utilized to implement the various operations discussed above.

Figure 5:
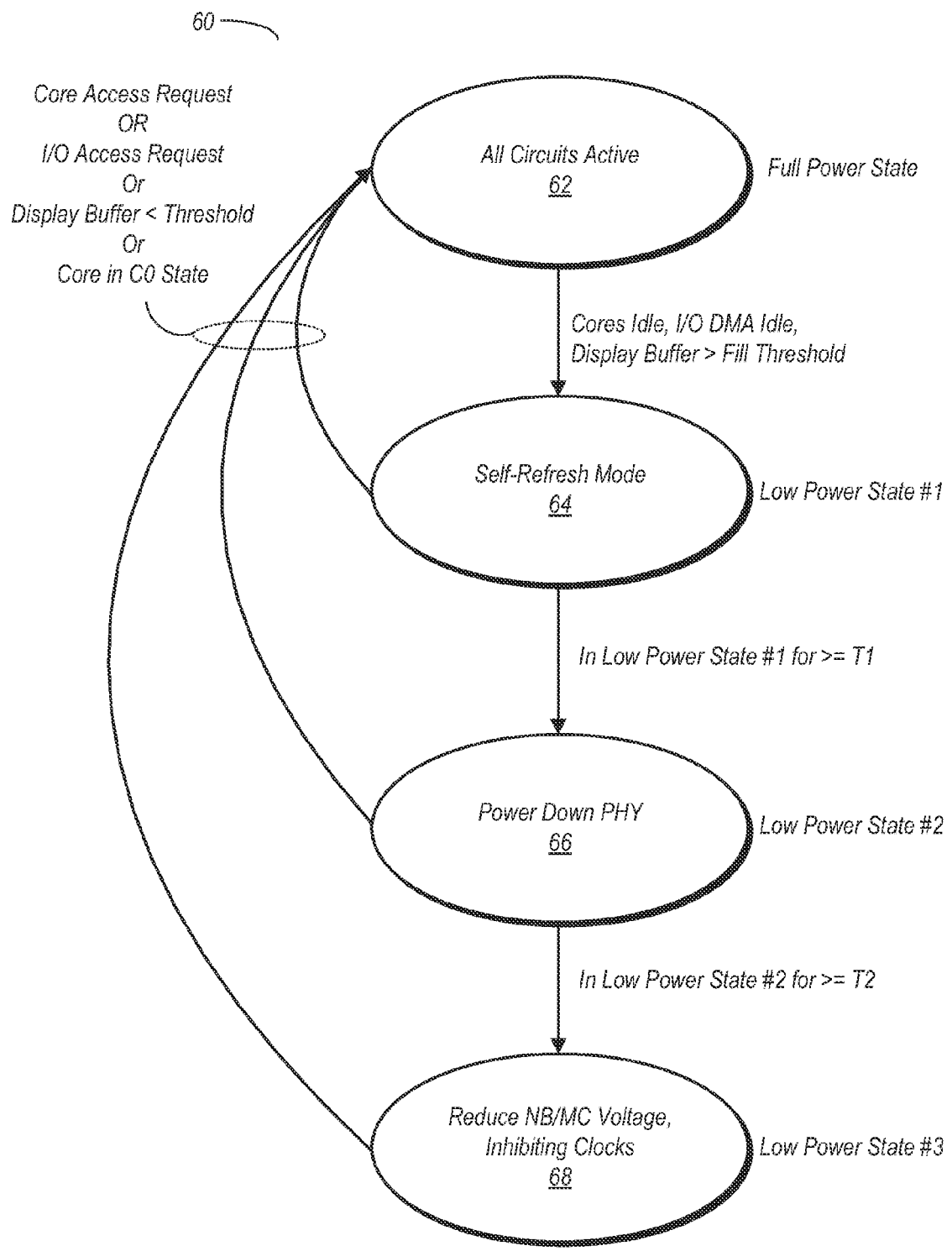
FIG. 5 is a state diagram illustrating the operation of one embodiment of a system including a power management unit.
Figure 6:
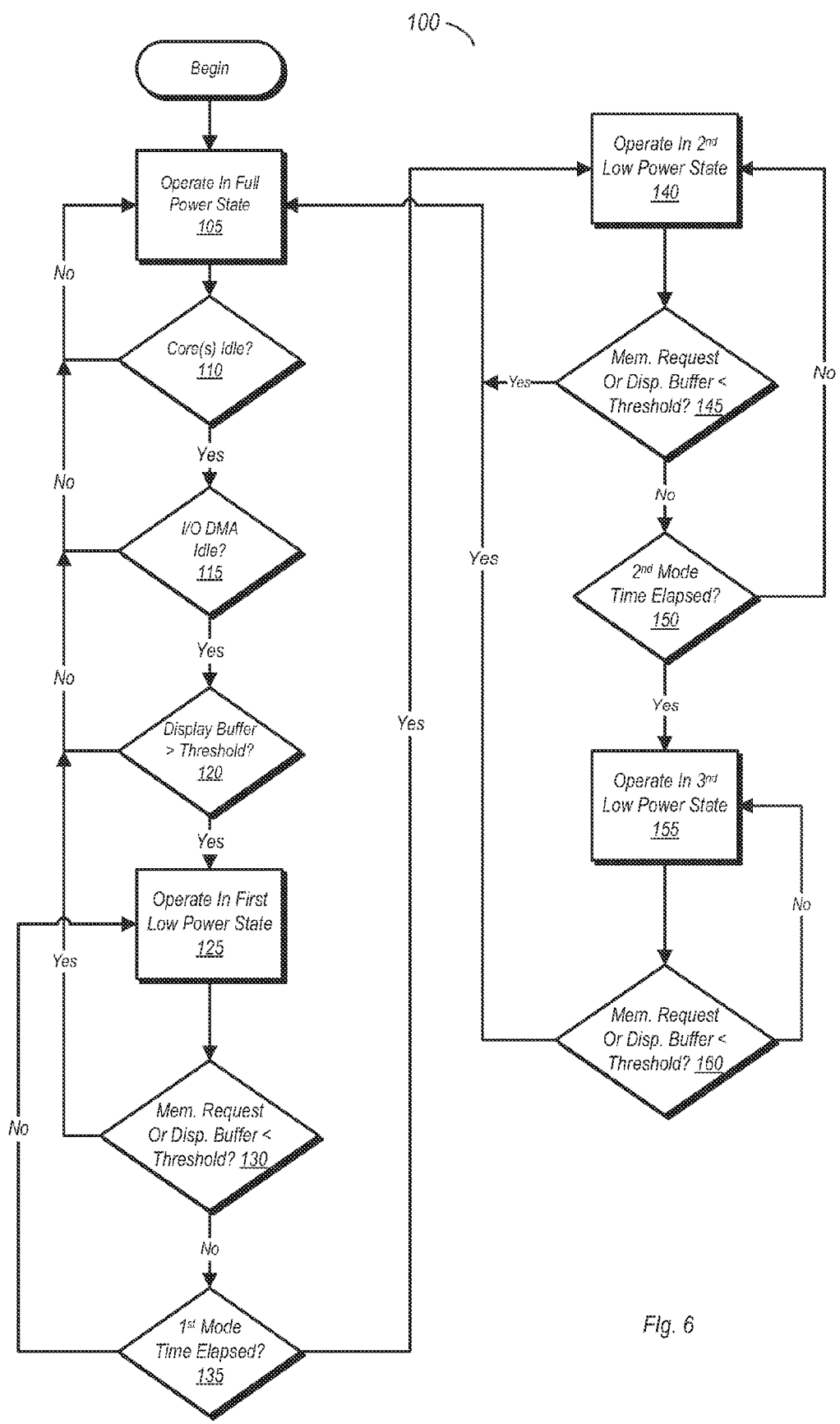
FIG. 6 is a flow diagram illustrating the operation of one embodiment of a system including a power management unit.

State Diagram and Method Flow:

FIGS. 5 and 6 illustrate additional details regarding an embodiment of a method for performing memory power management. The methods illustrated by FIGS. 5 and 6 may be performed by various embodiments of the hardware discussed above, and may also be implemented by other embodiments not explicitly disclosed herein.

Turning now to FIG. 5, a state diagram illustrating the operation of one embodiment of a system including a power management unit (such as power management unit 20 as discussed above). More particularly, state diagram 60 illustrates the transitioning between various low power states and a full power state for an embodiment of a system having a power management unit. In state 62, operation takes place in a full power state in which all circuits of a memory subsystem (e.g., memory subsystem 40) are active. If certain conditions occur, the system may transition its operation from the full power state to a first low power state. These conditions include idleness of the processor cores and I/O devices capable of asserting DMA requests, operation of the cores in the non-C0 state for embodiments that conform to the ACPI specification, as well as a display buffer having an amount of data stored therein that exceeds a threshold value. For the purposes of state diagram 60, idleness of processor cores may be defined as none of the cores having asserted a memory access request for at least a first amount of time, or the cores being in a non-C0 state in ACPI embodiments. Idleness of the I/O devices for the purposes of state diagram 60 may be defined as none of the I/O devices coupled to an I/O unit (e.g., I/O unit 13) having asserted a DMA request for at least a second amount of time. Thus, if the cores and the I/O devices are idle and the amount of data stored by the display buffer exceeds the threshold value, the system may transition to the first low power state.

State 64 in the embodiment shown corresponds to the first low power state ('Low Power State #1'). When in state 64, a system memory may be placed in a self-refresh mode of operation, with the memory controller discontinuing refresh operations. If the system continues operation in the first low power state for at least a time T1 (indicating continued idleness of the cores and the I/O DMA requestors and the display buffer being filled above the threshold value), the system may transition to a second low power state corresponding to state 66 in the diagram. When in state 66, a physical layer of a memory interface may be powered down, resulting in further power saving action. Operation in the self-refresh mode may continue as well. After remaining in the second low power state for a time T2, the system may transition to a third low power state, which corresponds to state 68 in the diagram. In addition to the previous power saving actions, operation in the third low power state may include reducing the supply voltage provided to the north bridge or at least the memory controller, and the inhibiting of clock signals provided to the memory controller.

If, during operation in any one of the low power states, a memory request is asserted by a core and/or I/O device, or the amount of data falls below the threshold value, operation may return to the full power state. Additionally, if the embodiment conforms to the ACPI specification, transition of any core to the C0 state may also cause operation to return to the full power state. Returning to the full power state may include restoring power to all circuits of the memory subsystem.

FIG. 6 is a flow diagram illustrating the operation of one embodiment of a system including a power management unit. In the embodiment shown, method 100 begins with operation in the full power state (block 105). During operation in the full power state, one or more processor cores may be monitored for idleness (block 110). As defined herein, idleness may include a first time elapsing from a most recent memory request asserted by any one of the one or more processor cores. If at least one of the processor cores has asserted a memory request before the first time has elapsed, the core may be considered active (block 110, No), and operation in the full power state may continue.

If the processor cores have been idle for at least the first time (block 110, Yes), a determination may be made as to whether I/O DMA requestors are also idle (block 115). Idleness for the I/O DMA requestors (e.g., DMA capable devices coupled to a peripheral bus) may be ascertained by determining whether or not a second time has elapsed since the most recent DMA request. If the I/O DMA requestors are not idle (block 115, No), then operation may continue in the full power state. If the DMA requestors are determined to be idle (block 115, yes), then a first condition for entering a low power state is satisfied.

In the embodiment shown, method 100 is directed toward a computer system in which main memory is shared with video memory (UMA, as discussed above). Accordingly, method 100 also includes monitoring a display buffer and comparing the amount of data stored therein with a threshold value (block 120). If the amount of data stored in the display buffer is less than the threshold value (block 120, No), then operation may continue in the full power state. However, if the amount of data in the display buffer exceeds the threshold value (block 120, yes), then the system may being operating in the first low power state (block 125). In embodiments wherein main memory is not shared with video memory (NUMA, as discussed above), block 120 may be skipped, and entry into the first low power state may occur responsive to a 'Yes' condition from block 115. Similarly, other method steps discussed below may be performed without regard to the amount of data in the display buffer in NUMA systems.

Operation in the first low power state may include one or more actions designed to conserve power. In one embodiment, a memory may be placed into a self-refresh mode, thereby discontinuing refresh operations provided by the memory controller. Such self-refresh operations may consume less power than the normal refresh operations. Other embodiments may perform other power reduction actions as an alternative, or in addition to operation in the self-refresh mode (e.g., powering down circuitry that is not used when in the self-refresh mode).

While operating in the first low power state, the monitoring for memory access requests and the amount of data stored in the display buffer may continue. If a memory request is asserted by a processor core or an I/O device or if the amount of data in the display buffer falls below the threshold value (block 130, Yes), then the system may exit the first low power state and return to the full power state. Otherwise, if operation continues in the first low power state, the amount of time in that state may be monitored (block 135). If the amount of time operating in the first low power state is less than a predetermined value (block 135, No), then operation in the first low power state may continue. Otherwise, if the predetermined time in the first low power state has elapsed, (block 135, yes), then operation of the system may transition to the second low power state (block 140).

Operation in the second low power state may include continuance of the power saving actions taken in the first low power state, along with additional power saving actions. In one embodiment, operation in the second low power state may include removing power from a physical layer of a memory interface, in addition to the power saving actions performed in the first low power state. Thus, operation in the second low power state may provide more power savings than operation in the first low power state.

Similar to operation in the first low power state, monitoring for memory requests and determining the amount of data stored in the display buffer (block 145) may be performed in the second low power state. If the amount of data in the display buffer falls below the threshold or a memory request is asserted (block 145, Yes), operation of the system transitions back to the full power state. Otherwise (block 145, No), operation in the second low power state may continue, with the amount of time operating in that state may be monitored (block 150). If the amount of time in the second low power state is less than a predetermined time (block 150, No), operation in the second low power state may continue. Otherwise, if the predetermined time in the second low power state has elapsed (block 150, Yes), then the system may transition to operation in the third low power state (block 155).

Operation in the third low power state may include the power saving actions performed in the first and second low power states, as well as additional actions. In one embodiment, a supply voltage provided to the memory subsystem may be reduced. Clock signals provided to the memory and memory controller may also be inhibited, thereby providing further power savings. In this particular embodiment, operation in the third low power state may continue indefinitely. Monitoring for memory requests and the amount of data stored in the display buffer may continue (block 160). If the amount of data in the display buffer continues to exceed the threshold value and the memory requestors remain idle (block 160, No), then operation may continue in the third low power state. Otherwise, (block 160, Yes), the system may transition back to a full power state if a memory request is asserted or the amount of data in the display buffer falls below the threshold value.

While the embodiment of method 100 has been discussed herein with reference to a full power state and three different low power states, embodiments having additional states are possible and contemplated. For example, an embodiment having a fourth state wherein the system hibernates after a certain amount of time in the third state may be implemented. Furthermore, embodiments are possible and contemplated wherein a lesser number of low power states are implemented. For example, in one embodiment the second and third low power states could be consolidated into a single low power state that may be entered after a predetermined time in the first low power state.

Low Power State Operation During Video Streaming Operation:

As noted above, some computer systems may be implemented as a UMA system, wherein main memory is shared with video memory. A display/video engine (e.g., display video 14) may include a display buffer (e.g., display buffer 142), and may fill this buffer by accessing video data directly from the shared memory (i.e. without intervention of the processor). The buffer may be a FIFO memory, and data stored therein may be accessed ('drained') and processed for display on a video display unit. In some cases, filling the buffer may be accomplished faster than it is drained when processing video data for display. This characteristic may be taken advantage of to enable power saving in various embodiments of a system as discussed above.

Figure 7:
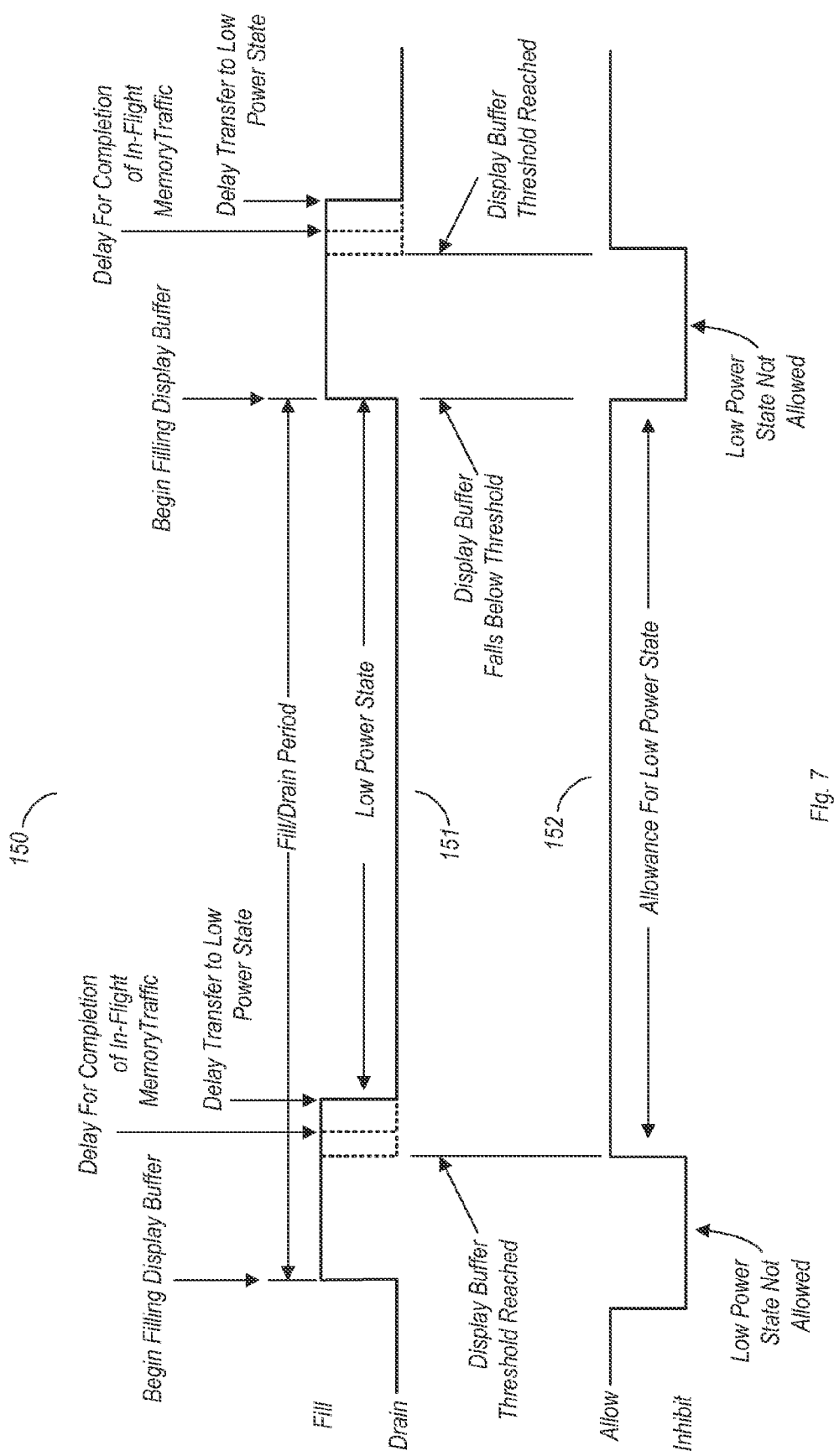
FIG. 7 is a timing diagram illustrating the operation of an embodiment of a system including a power management unit when a display buffer is providing data to a display.

Turning now to FIG. 7, a timing diagram illustrating the operation of an embodiment of a computer system when a display buffer is providing data to for processing and display. In the embodiment shown, timing diagram 150 illustrates how one embodiment of a system may transition between the full power mode and the first low power mode when processing video information.

As the display buffer drains due to the processing of video data, the amount of data eventually falls below a threshold value. When this occurs, power management state 152 may fall from the 'Allow' state to the 'Inhibit' state. When in the 'Inhibit' state, a power management unit may inhibit the system from entering the first low power state, instead holding it in the full power state. Furthermore, when the amount of display buffer data falls below the threshold value, the display buffer state 151 may change from 'Drain' to 'Fill'. At this point, the display/video engine may begin memory accesses to fill the display buffer with video data. It should be noted that the display buffer may also be drained in this state so that the display/video engine may continue processing data, although the rate of draining may be exceeded by the rate of filling.

Once the display buffer is filled enough to exceed a display buffer threshold value, power management state 152 may transition back to the 'Allow' state. In this state, transitioning to at least a first low power state may occur after a delay. The delay as shown in the drawing may include two components. A first of these components is a delay for handling any remaining in-flight memory traffic (e.g., from main memory to the display buffer). An additional delay may be provided to allow any other requirements for transfer to the low power state to be fulfilled. One such requirement may be, in one embodiment, assertion of a signal intended to cause the memory to enter the self-refresh mode, wherein the delay includes the necessary set-up and hold times for this signal to be received. In the example shown, entry into the first low power state may be performed immediately upon satisfying the delay for responding to in-flight memory traffic. However, in some embodiments, a requirement for entry into the first low power state includes the display buffer continuing filing until full, which may add to the delay before entry into the first low power state After the display buffer reaches the display buffer threshold, or once it is filled (depending on the particular embodiment), display buffer state 151 may transition to the 'Drain' state as the memory is transitioned into the first low power state ('Low Power State'). In the drain state, the display buffer is not being filled with video data from memory but is draining. As the video data is read from the display buffer, it may be processed by the display/video engine and output to the display unit as video. The draining of the display buffer may continue until the amount of data remaining falls below the display buffer threshold (it is noted that the display buffer may continue draining when in the 'Fill' state, although the net effect may be that the amount of data in the buffer increases when the rate of filling the buffer exceeds the rate of draining). At this point, power management state 152 may transition from the 'Allow' state back to the 'Inhibit state. Display buffer state 151 may respond to the passing the display buffer threshold by returning to the 'Fill' state as operation exits the first low power state, although this transition may not be immediate to the latency that may be induced by the system transitioning back to the full power state. After the display buffer begins refilling, the cycle may repeat itself. The repeating of the cycle may occur at a period referred to as the 'Fill/Drain' period here.

In the example above, the power savings may be quantified by calculating the amount of time spent in the first low power state relative to the Fill/Drain period. For example, consider a configuration utilizing a display resolution of 1366×786 with 4 byte/pixel encoding, a display frequency of 60 Hz, a compression ratio of 4:1, a display buffer fill frequency of 333 Mhz, and a display buffer size of 18 lines. In such an example, the Fill/Drain period is 360 microseconds, while the display buffer may be filled in 9.3 microseconds. Thus, the amount of time allowed in the first low power state is 360−9.3=350.7 microseconds. Using the formula:

$$\text{Efficiency} = \frac{TimeinLowPowerState}{Fill/DrainPeriod},$$

the efficiency is determined to be 97.4%. Accordingly, a significant power savings may be realized when operating in this manner while retaining the ability for display refresh in system idle cases or video playback.

Figure 8:
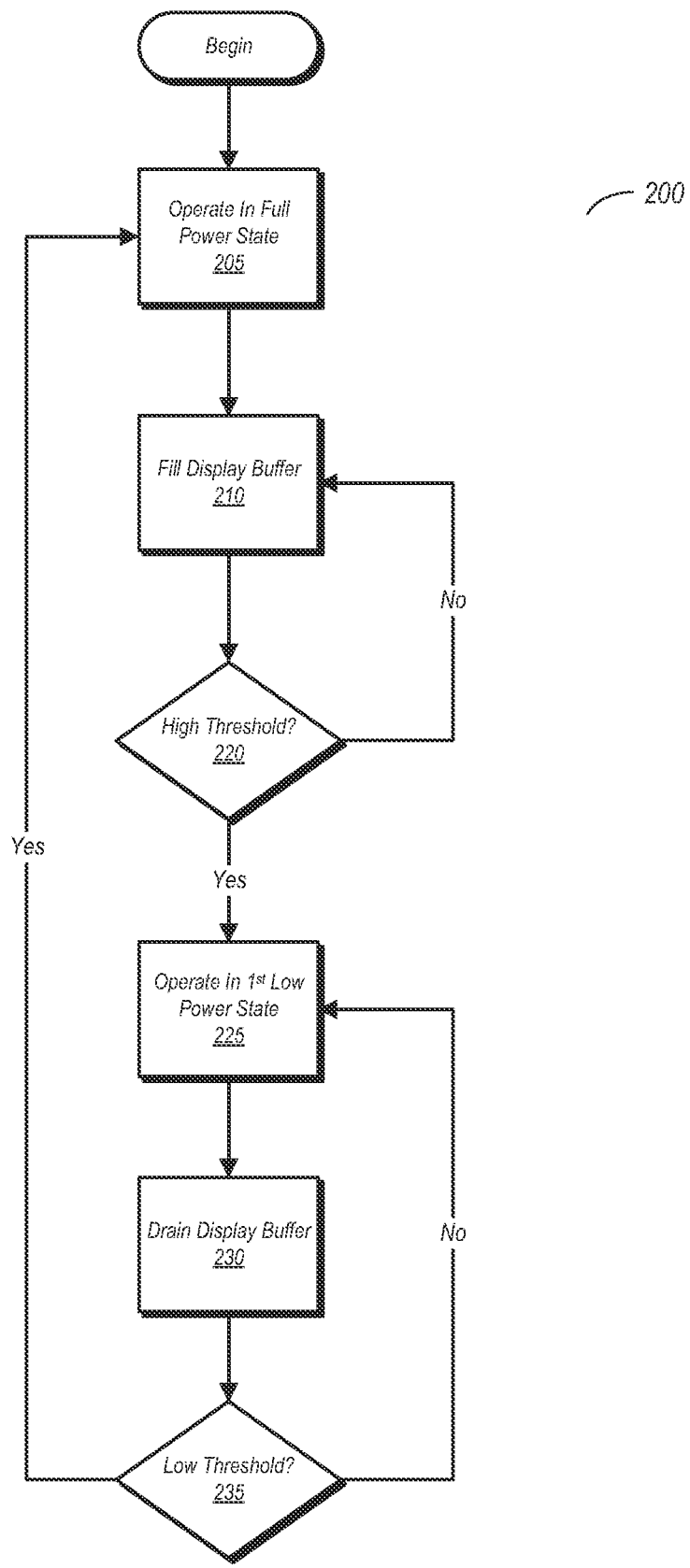
FIG. 8 is a flow diagram illustrating the operation of an embodiment of a system including a power management unit when a display buffer is providing data to a display.

A flow diagram of such a method is shown in FIG. 8. In the embodiment shown, method 200 begins with operation in the full power mode (block 205). While operating in the full power mode, the display buffer may be filled (block 210). As noted above, the display buffer may be drained concurrent with the fill operation, however, since the display buffer may fill faster than it drains, the net effect results in an increase in the amount of data in the buffer. If the display buffer is filling but has not yet reached the high display buffer threshold (block 220, No), then the fill operation continues. If fill operation has completed (block 220, yes), then entry into the first low power mode may be permitted.

After the fill operation is complete (either when the buffer is completely full, or after reaching the display buffer threshold), the system may begin operation in the first low power mode (block 225). Concurrent with entering the low power mode, the display buffer may be drained (block 230) as the display/video engine processes the video data for display. The monitoring of the amount of data remaining in the display buffer may continue as the display buffer is drained. If the amount of data remaining in the display buffer is less than the low display buffer threshold value (block 235, Yes), then operation of the system transitions back into the full power mode, and the fill operation may begin again. Otherwise, if the amount of data remaining in the buffer is greater than the low display buffer threshold value (block 235, No), then operation in the first low power mode may continue.

Figure 9:
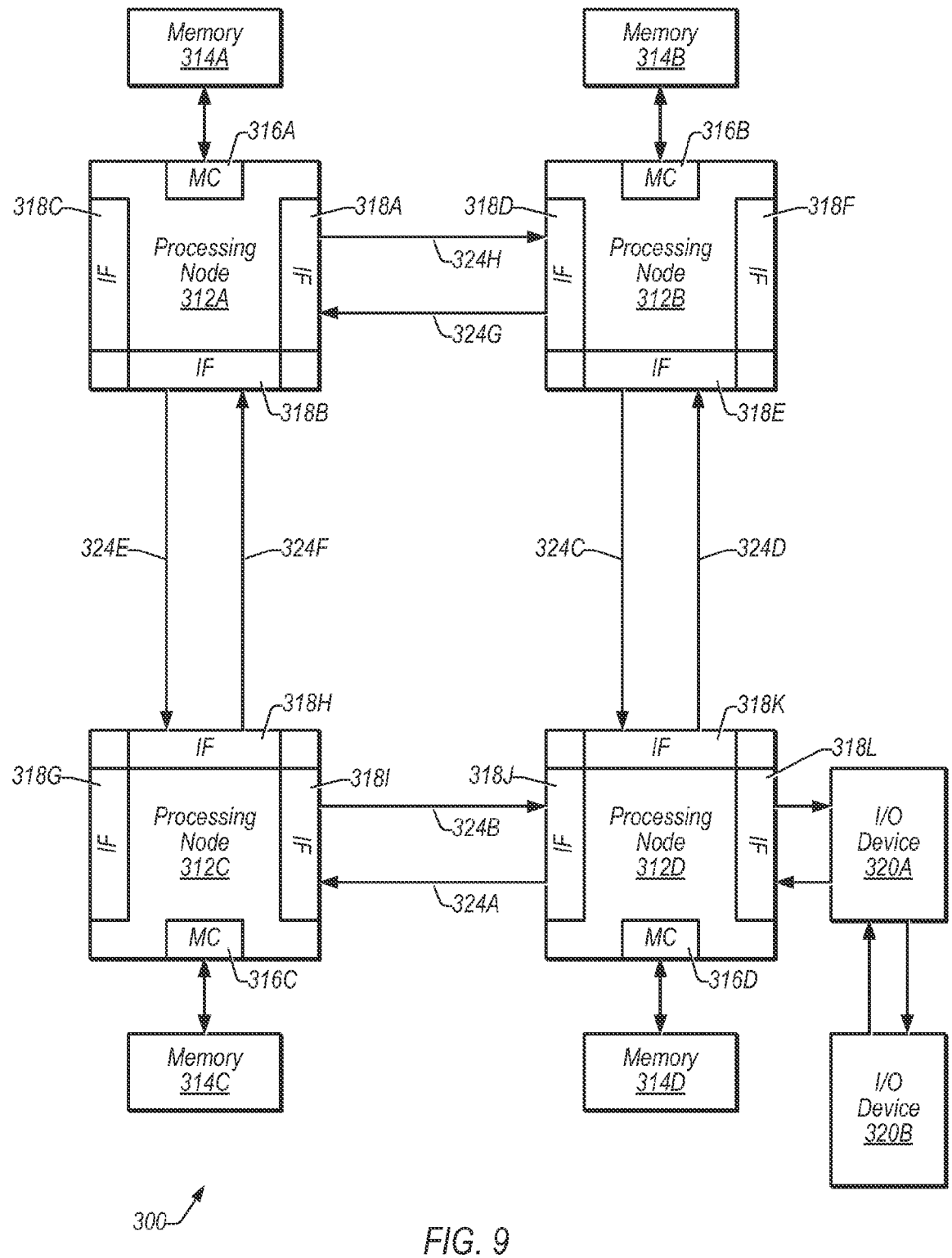
FIG. 9 is a block diagram of one embodiment of a computer system.

Computer System:

Turning now to FIG. 9, an embodiment of a computer system 300 is shown. In the embodiment of FIG. 9, computer system 300 includes several processing nodes 312A, 312B, 312C, and 312D. One or more of these processing nodes may be an embodiment similar to IC 2 as shown in FIGS. 1A and 1B. More particularly, any one (or all) of processor nodes 312A-312D may include a power management unit configured to operate in accordance with the embodiments discussed above. Each processing node is coupled to a respective memory 314A-314D via a memory controller 316A-316D included within each respective processing node 312A-312D. One or more of these memory controllers 316A-316D may be configured in accordance with an embodiment of a memory controller 18 as discussed above. Thus, in processing units that are so configured, power management may be conducted to minimize the use of power by a corresponding memory subsystem.

Each of processing nodes 312A-312D include interface logic used to communicate between the processing nodes 312A-312D. For example, processing node 312A includes interface logic 318A for communicating with processing node 312B, interface logic 318B for communicating with processing node 312C, and a third interface logic 318C for communicating with yet another processing node (not shown). Similarly, processing node 312B includes interface logic 318D, 318E, and 318F; processing node 312C includes interface logic 318G, 318H, and 318I; and processing node 312D includes interface logic 318J, 318K, and 318L. Processing node 312D is coupled to communicate with a plurality of input/output devices (e.g. devices 320A-320B in a daisy chain configuration) via interface logic 318L. Other processing nodes may communicate with other I/O devices in a similar fashion.

Processing nodes 312A-312D implement a packet-based link for inter-processing node communication. In the present embodiment, the link is implemented as sets of unidirectional lines (e.g. lines 324A are used to transmit packets from processing node 312A to processing node 312B and lines 324B are used to transmit packets from processing node 312B to processing node 312A). Other sets of lines 324C-324H are used to transmit packets between other processing nodes as illustrated in FIG. 4. Generally, each set of lines 324 may include one or more data lines, one or more clock lines corresponding to the data lines, and one or more control lines indicating the type of packet being conveyed. The link may be operated in a cache coherent fashion for communication between processing nodes or in a noncoherent fashion for communication between a processing node and an I/O device (or a bus bridge to an I/O bus of conventional construction such as the Peripheral Component Interconnect (PCI) bus or Industry Standard Architecture (ISA) bus). Embodiments are also possible and contemplated wherein communication between a processing node and an I/O device is performed in a cache coherent fashion. Furthermore, the link may be operated in a non-coherent fashion using a daisy-chain structure between I/O devices as shown. It is noted that a packet to be transmitted from one processing node to another may pass through one or more intermediate nodes. For example, a packet transmitted by processing node 312A to processing node 312D may pass through either processing node 312B or processing node 312C as shown in FIG. 9. Any suitable routing algorithm may be used. Other embodiments of computer system 300 may include more or fewer processing nodes then the embodiment shown in FIG. 9.

Generally, the packets may be transmitted as one or more bit times on the lines 324 between nodes. A bit time may be the rising or falling edge of the clock signal on the corresponding clock lines. The packets may include command packets for initiating transactions, probe packets for maintaining cache coherency, and response packets from responding to probes and commands.

Processing nodes 312A-312D, in addition to a memory controller and interface logic, may include one or more processors. Broadly speaking, a processing node comprises at least one processor and may optionally include a memory controller for communicating with a memory and other logic as desired. More particularly, each processing node 312A-312D may implemented on an embodiment of IC 2 as shown in FIGS. 1A and 1B, and may include various structural elements such as those shown therein, as well as in FIGS. 2-4. One or more processors may comprise a chip multiprocessing (CMP) or chip multithreaded (CMT) integrated circuit in the processing node or forming the processing node, or the processing node may have any other desired internal structure.

Memories 314A-314D may comprise any suitable memory devices. For example, a memory 314A-314D may comprise one or more RAMBUS DRAMs (RDRAMs), synchronous DRAMs (SDRAMs), DDR SDRAM, static RAM, etc. The address space of computer system 300 is divided among memories 314A-314D. Each processing node 312A-312D may include a memory map used to determine which addresses are mapped to which memories 314A-314D, and hence to which processing node 312A-312D a memory request for a particular address should be routed. In one embodiment, the coherency point for an address within computer system 300 is the memory controller 316A-316D coupled to the memory storing bytes corresponding to the address. In other words, the memory controller 316A-316D is responsible for ensuring that each memory access to the corresponding memory 314A-314D occurs in a cache coherent fashion. Memory controllers 316A-316D may comprise control circuitry for interfacing to memories 314A-314D. Additionally, memory controllers 316A-316D may include request queues for queuing memory requests.

Generally, interface logic 318A-318L may comprise a variety of buffers for receiving packets from the link and for buffering packets to be transmitted upon the link. Computer system 300 may employ any suitable flow control mechanism for transmitting packets. For example, in one embodiment, each interface logic 318 stores a count of the number of each type of buffer within the receiver at the other end of the link to which that interface logic is connected. The interface logic does not transmit a packet unless the receiving interface logic has a free buffer to store the packet. As a receiving buffer is freed by routing a packet onward, the receiving interface logic transmits a message to the sending interface logic to indicate that the buffer has been freed. Such a mechanism may be referred to as a "coupon-based" system.

I/O devices 320A-320B may be any suitable I/O devices. For example, I/O devices 320A-320B may include devices for communicating with another computer system to which the devices may be coupled (e.g. network interface cards or modems). Furthermore, I/O devices 320A-320B may include video accelerators, audio cards, hard or floppy disk drives or drive controllers, SCSI (Small Computer Systems Interface) adapters and telephony cards, sound cards, and a variety of data acquisition cards such as GPIB or field bus interface cards. Furthermore, any I/O device implemented as a card may also be implemented as circuitry on the main circuit board of the system 300 and/or software executed on a processing node. It is noted that the term "I/O device" and the term "peripheral device" are intended to be synonymous herein.

Figure 10:
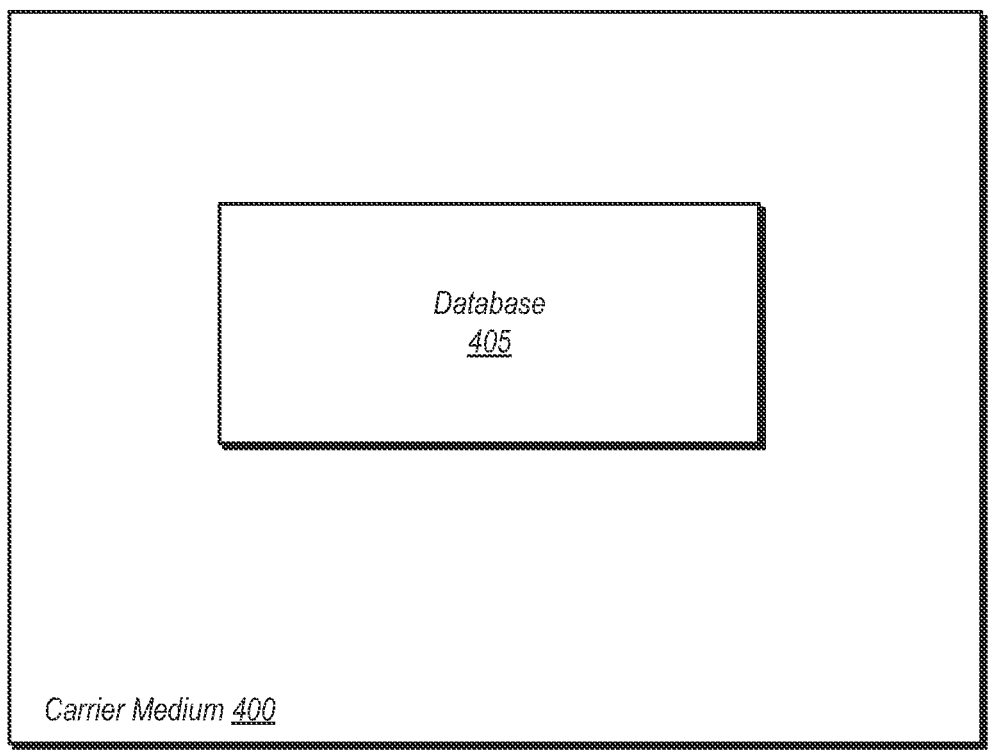
FIG. 10 is a block diagram of one embodiment of a computer readable medium including a data structure describing an embodiment of circuitry including a power management unit.

Computer Readable Medium:

Turning next to FIG. 10, a block diagram of a computer accessible storage medium 400 including a database 405 representative of the system 10 is shown. Generally speaking, a computer accessible storage medium 400 may include any storage media accessible by a computer during use to provide instructions and/or data to the computer. For example, a computer accessible storage medium 400 may include storage media such as magnetic or optical media, e.g., disk (fixed or removable), tape, CD-ROM, or DVD-ROM, CD-R, CD-RW, DVD-R, DVD-RW, or Blu-Ray. Storage media may further include volatile or non-volatile memory media such as RAM (e.g. synchronous dynamic RAM (SDRAM), double data rate (DDR, DDR2, DDR3, etc.) SDRAM, low-power DDR (LP-DDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media may include microelectromechanical systems (MEMS), as well as storage media accessible via a communication medium such as a network and/or a wireless link.

Generally, the database 405 of the system 10 carried on the computer accessible storage medium 400 may be a database which can be read by a program and used, directly or indirectly, to fabricate the hardware comprising the system 10. For example, the database 405 may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising the system 10. The netlist may then be placed and routed to produce a data set describing geometric shapes to be applied to masks. The masks may then be used in various semiconductor fabrication steps to produce a semiconductor circuit or circuits corresponding to the system 10. Alternatively, the database 405 on the computer accessible storage medium 400 may be the netlist (with or without the synthesis library) or the data set, as desired.

While the computer accessible storage medium 400 carries a representation of the system 10, other embodiments may carry a representation of any portion of the system 10, as desired, including any set of agents (e.g., processor cores 11, I/O interface 13, power management unit 20, etc.) or portions of agents (e.g., RM 22 and or BM 24 of power management unit 20, etc.).

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method comprising:
monitoring requests for access to a memory of a memory subsystem directly asserted by one or more processor cores, wherein the memory is a main memory of a computer system;
monitoring requests for access to the memory conveyed by an input/output (I/O) unit;
asserting a first signal if at least a first amount of time has elapsed since any one of the processor cores has asserted a memory access request and at least a second amount of time has elapsed since the I/O unit has conveyed a memory request;

asserting a second signal if an amount of data stored in a display buffer exceeds a threshold value;

filling the display buffer with an amount of data that exceeds the threshold value if the amount of data in the display buffer is less than the threshold value;

transitioning the memory subsystem from a full power state to a first low power state responsive to assertion of the first and second signals;

draining the display buffer of data;

de-asserting the second signal responsive to the amount of data in the display buffer falling below the threshold value; and transitioning from the first low power state to the full power state responsive to the de-assertion of the second signal.

2. The method as recited in claim 1, further comprising determining if the memory subsystem has been in the first low power state for at least third amount of time, and transitioning the memory to a second low power state if the third amount of time has elapsed.

3. The method as recited in claim 2, wherein transitioning from the first low power state to the second low power state includes removing power from a physical layer of an interface to the memory.

4. The method as recited in claim 2, further comprising determining if the memory subsystem has been in the second low power state for at least a fourth amount of time, and transitioning to a third low power state if the fourth amount of time has elapsed.

5. The method as recited in claim 4, wherein transitioning from the second low power state to the third low power state includes reducing a supply voltage provided to a memory controller of the memory subsystem, and inhibiting a clock to signal provided to the memory controller.

6. The method as recited in claim 1, further comprising inhibiting transitioning the memory subsystem from the full power state to the first low power state if either of the first or second signals is not asserted.

7. The method as recited in claim 1, further comprising transitioning the memory subsystem from a state other than the full power state to the full power state responsive to one or more of the following:

assertion of a request for access to the memory by one or more processor cores; the I/O unit conveying a request for access to the memory.

8. The method as recited in claim 1, further comprising inhibiting transitioning the memory subsystem from the full power state to the first low power state if the first signal is not asserted.

9. The method as recited in claim 1, wherein transitioning the memory subsystem from the full power state to the first low power state comprises initiating operation of the memory in a self-refresh mode.

10. A system comprising:

one or more processor cores each configured to directly assert requests for access to a memory;

an input/output (I/O) unit configured to directly assert requests for access to the memory;

a memory subsystem including the memory and a memory controller, wherein the memory is a main memory of the system;

a display engine including a display buffer;

a power management unit configured to:

monitor requests for access to the memory asserted by each of the one or more processor cores;

monitor requests for access to the memory conveyed by an input/output (I/O) unit;

determine if at least a first amount of time has elapsed since any one of the processor cores has asserted a memory access request;

determine if at least a second amount of time has elapsed since the I/O unit has conveyed a memory access request; and assert a first signal if the first and second amounts of time have elapsed;

assert a second signal if the amount of data stored in the display buffer exceeds a threshold value;

wherein the memory controller is coupled to receive the first and second signals, and wherein the memory subsystem is configured to transition from a full power state to a first low power state responsive to assertion of the first and second signals;

wherein the memory controller is configured to cause display buffer with an amount of data that exceeds the threshold value if the amount of data in the display buffer is less than the threshold value and wherein the display engine is configured to drain the display buffer data at least until the amount of data in the display buffer falls below the threshold value, wherein the power management unit is configured to cause the memory subsystem to exit the low power state by asserting the second signal responsive to detecting that the amount of data in the display buffer has fallen below the threshold value.

11. The system as recited in claim 10, wherein the power management unit is configured to determine if the memory subsystem has been in the first low power state for a third amount of time and further configured to cause the memory subsystem to transition from the first low power state to a second low power state if the third amount of time has elapsed.

12. The system as recited in claim 11, wherein the memory controller is configured to power down a physical layer of an interface to the memory when transitioning from the first low power state to the second low power state.

13. The system as recited in claim 11, wherein the power management unit is configured to determine if the memory subsystem has been in the second low power state for at least a fourth amount of time, and further configured to cause the memory subsystem to transition to a third low power state if the fourth amount of time has elapsed.

14. The system as recited in claim 13, wherein the power management unit is configured to reduce a supply voltage provided to the memory controller and inhibit a clock signal provided to the memory controller in order to cause the memory subsystem to transition from the second low power state to the third low power state.

15. The system as recited in claim 10, wherein the power management unit is configured to inhibit the memory subsystem from transitioning from the full power state to the first low power state if either of the first or second signals is not asserted.

16. The system as recited in claim 10, wherein the power management unit is configured to, when the memory subsystem is not in the full power state, cause the memory subsystem to transition to the full power state responsive to one or more of the following:

assertion of a request for access to the memory by one or more processor cores;

the I/O unit conveying a request for access to the memory.

17. The system as recited in claim 10, wherein the power management unit is configured to inhibit the memory subsystem from transitioning from the full power state to the first low power state if the first signal is not asserted.

18. The system as recited in claim 10, wherein the memory controller is configured to cause the memory to operate in a self-refresh mode when in the first low power state.

19. A processor comprising:
   a memory controller;
   one or more processor cores, wherein each of the one or more processor cores is configured to assert memory access requests to the memory controller;
   an input/output (I/O) unit, wherein the I/O unit is configured to convey memory access requests from one or more I/O devices to the memory controller;
   a display buffer configured to store data to be displayed on a display unit; and
   a power management unit, wherein the power management unit is configured to determine if each of the one or more processor cores are in a non-executing state and if a first amount time has elapsed since the I/O unit has conveyed a memory request, and further configured to assert a first signal if the first amount of time has elapsed;
   wherein the power management unit is configured to monitor an amount of data stored in the display buffer and further configured to assert a second signal if the amount of data stored in the display buffer is greater than a first threshold value;
   wherein the memory controller is configured to cause a memory subsystem to transition from a full power state to a first low power state responsive to assertion of at least the first signal; and wherein the power management unit is further configured to:
      cause the memory subsystem to enter a second low power state responsive to the memory subsystem remaining in the first low power state for a second amount of time; and
      cause the memory subsystem to enter a third low power state responsive to the memory subsystem remaining in the second low power state for a third amount of time.

20. The processor as recited in claim 19, wherein the power management unit is configured to de-assert the second signal if the amount of data in the display buffer falls below the second threshold, wherein the memory subsystem is configured to enter the full power state responsive to de-assertion of the second signal; and
   wherein the power management unit is configured to inhibit the memory subsystem from transitioning from the full power state to the first low power state if the first signal is not asserted.

21. The processor as recited in claim 19, wherein the power management unit is configured to:
   cause a memory of the memory subsystem to perform self-refresh operations when operating in the first low power state;
   remove power from a physical layer of a memory interface in the memory controller when operating in the second low power state; and
   reduce voltage and inhibit a clock signal to the memory controller when operating in the third low power state.

22. The processor as recited in claim 19, wherein the power management unit is configured to, when the memory subsystem is not operating in the full power state, cause the memory subsystem to transition to the full power state responsive to one or more of the following:
   assertion of a request for access to the memory by one or more processor cores;
   transition of at least one of the one or more processor cores from a non-executing state to an executing state;
   the I/O unit conveying a request for access to the memory.

23. A computer readable medium comprising a data structure which is operated upon by a program executable on a computer system, the program operating on the data structure to perform a portion of a process to fabricate circuitry described by the data structure, the circuitry described in the data structure including:
   one or more processor cores;
   an input/output (I/O) unit;
   a memory subsystem including a memory and a memory controller, wherein the memory is a main memory;
   a display engine including a display buffer;
   a power management unit configured to:
      monitor requests for access to the memory directly asserted by each of the one or more processor cores;
      monitor requests for access to the memory conveyed by an input/output (I/O) unit;
      determine if at least a first amount of time has elapsed since any one of the processor cores has asserted a memory access request;
      determine if at least a second amount of time has elapsed since the I/O unit has conveyed a memory access request; and
      assert a first signal if the first and second amounts of time have elapsed;
      assert a second signal if the amount of data stored in the display buffer exceeds a threshold value;
   wherein the memory controller is coupled to receive the first and second signals, and wherein the memory subsystem is configured to transition from a full power state to a first low power state responsive to assertion of the first and second signals;
   wherein the memory controller is configured to cause display buffer with an amount of data that exceeds the threshold value if the amount of data in the display buffer is less than the threshold value and wherein the display engine is configured to drain the display buffer data at least until the amount of data in the display buffer falls below the threshold value, wherein the power management unit is configured to cause the memory subsystem to exit the low power state by asserting the second signal responsive to detecting that the amount of data in the display buffer has fallen below the threshold value.

24. The computer readable medium as recited in claim 23, wherein the power management unit described in the data structure is configured to determine if the memory subsystem has been in the first low power state for a third amount of time and further configured to cause the memory subsystem to transition from the first low power state to a second low power state if the third amount of time has elapsed.

* * * * *